United States Patent
Ranish

(10) Patent No.: US 9,175,908 B2
(45) Date of Patent: Nov. 3, 2015

(54) LAMPHEAD ATMOSPHERE

(75) Inventor: Joseph M. Ranish, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 688 days.

(21) Appl. No.: 13/445,543

(22) Filed: Apr. 12, 2012

(65) Prior Publication Data

US 2012/0270168 A1   Oct. 25, 2012

Related U.S. Application Data

(60) Provisional application No. 61/478,195, filed on Apr. 22, 2011, provisional application No. 61/509,821, filed on Jul. 20, 2011.

(51) Int. Cl.
  F27B 5/16    (2006.01)
  F27B 17/00   (2006.01)
  H01L 21/67   (2006.01)

(52) U.S. Cl.
  CPC ...... F27B 17/0025 (2013.01); H01L 21/67115 (2013.01)

(58) Field of Classification Search
  CPC ................................................ F27B 17/0025
  USPC ............. 432/29, 200; 219/390, 395, 405, 411
  See application file for complete search history.

(56) References Cited

U.S. PATENT DOCUMENTS

| | | | |
|---|---|---|---|
| 4,228,197 A | 10/1980 | Means | |
| 5,626,775 A | 5/1997 | Roberts et al. | |
| 6,376,804 B1 | 4/2002 | Ranish et al. | |
| 6,394,109 B1 | 5/2002 | Somekh | |
| 6,427,703 B1 | 8/2002 | Somekh | |
| 6,939,817 B2 | 9/2005 | Sandhu et al. | |
| 7,509,035 B2 | 3/2009 | Ranish et al. | |
| 2002/0148824 A1* | 10/2002 | Hauf et al. | 219/411 |
| 2006/0223315 A1* | 10/2006 | Yokota et al. | 438/689 |

* cited by examiner

Primary Examiner — Alissa Tompkins
Assistant Examiner — John Bargero
(74) Attorney, Agent, or Firm — Patterson & Sheridan, LLP

(57) ABSTRACT

A method and apparatus for thermal processing of semiconductor substrates is disclosed. Each lamp of a lamp assembly is immersed in a thermally conductive atmosphere comprising oxygen. As the lamps are operated, the oxygen reacts with carbon containing species. Consumed oxygen is replaced over time until the thermal conductivity of the atmosphere falls below a tolerance threshold. The atmosphere is then evacuated and replaced.

8 Claims, 2 Drawing Sheets

LAMPHEAD ATMOSPHERE

CROSS-REFERENCE TO RELATED APPLICATIONS

This application claims benefit of U.S. Provisional Patent Application Ser. No. 61/478,195, filed Apr. 22, 2011, and U.S. Provisional Patent Application Ser. No. 61/509,821, filed Jul. 20, 2011, both of which are incorporated herein by reference.

BACKGROUND OF THE INVENTION

1. Field of the Invention

Embodiments described herein relate to thermal processing in semiconductor manufacturing. More specifically, a lamp assembly, and methods of operating the lamp assembly, are described.

2. Description of the Related Art

Rapid thermal processing (RTP) systems are employed in semiconductor chip fabrication to create, chemically alter or etch surface structures on semiconductor wafers. One such RTP system, as described in U.S. Pat. No. 6,376,804, includes a lamp assembly located on the semiconductor processing chamber. The lamps are disposed in recesses of the assembly and covered with a window to isolate the lamps from the processing environment of the chamber.

As the lamps are operated, trace carbon compounds adventitiously introduced into the space around the lamps may deposit and/or decompose on the lamps, leaving a carbon residue that darkens the lamps over time. Moreover, as the lamps heat and cool during process cycles, the carbon residue may accumulate on lamp walls causing overheating which ultimately cause early failure of the lamps. It is not uncommon for lamps to become unusable less than 24 hours after being put in service.

As semiconductor processes continually aspire to higher efficiency and lower cost, there is a need to improve the longevity and cost-effectiveness of thermal lamp assemblies.

SUMMARY OF THE INVENTION

Embodiments described herein include a method of operating a bank of lamps by immersing the lamps in a thermally conductive gas having up to about 25% of an oxidizing gas. The oxidizing gas is consumed by reaction with carbon containing species in the atmosphere around the lamps, and is made up by flowing additional oxidizing gas into the atmosphere. Air may be allowed to leak into the atmosphere to make up the oxidizing gas. When the composition of the atmosphere around the lamps is such that the thermal conductivity of the atmosphere begins to decline, the gas is replaced.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Methods of managing fouling of process lamps, such as lamps and/or UV lamps, are described. The lamps described herein are generally energy discharge lamps that develop a temperature of at least about 300° C. during normal operation or discharge energy that may activate, dissociate, or decompose carbon containing compounds. A plurality of lamps may be disposed in a lamp assembly and operated as described herein, or a lamp may be operated singly as described herein.

Figure 1:
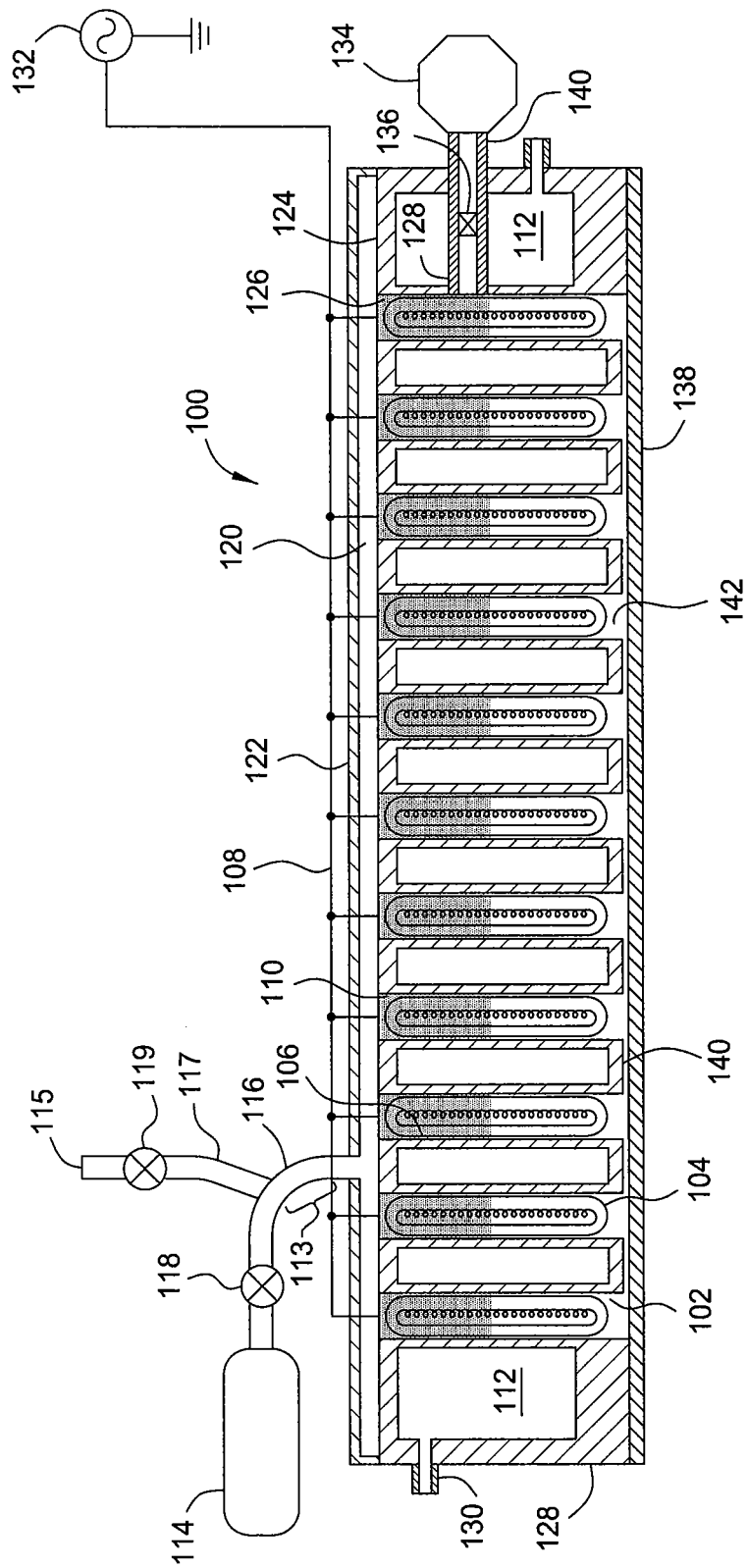
FIG. 1 is a cross-sectional view of a lamp assembly according to one embodiment.

FIG. 1 is a cross-sectional view of a lamp assembly 100 which may be used to practice methods described herein. The lamp assembly 100 has a plurality of recesses 102 in which lamps 104 are disposed. Each recess 102 may be a light pipe and may be lined by a reflector 106. Each lamp 104 is connected to an electrical circuit 108 outside the lamp assembly 100. More than one electrical circuit may be provided to power groups of lamps independently, if desired. The recesses 102 are open at one end to allow radiation from the lamps 104 to escape the lamp assembly 100 into a processing chamber (not shown) proximate the lamp assembly 100.

Each lamp 104 may be immobilized in an electrical socket 126 by seating in a potting compound 110. The potting compound 110 is typically a white material to reflect as much radiation as possible toward the open end of the recess 102. The potting compound 110 is typically also porous. In some embodiments, the potting compound comprises magnesium phosphate bonded zircon, or magnesium phosphate bonded aluminum nitride.

The openings of the recesses 102 are typically sealed by a window 138, which may be quartz. The window 138, which typically faces the processing region of the chamber, allows radiation from the lamps 104 to enter the processing chamber while protecting the lamps 104 and lamp assembly 100 from the processing environment. The recesses 102 therefore form a space around the lamps 104. This space is typically filled with an operating gas such as helium from a pressurized source 114. In a heat lamp embodiment, the operating gas will typically be a thermally conductive gas. The pressurized source 114 is connected to the lamp assembly 100 by a port 116 and valve 118. The operating gas is introduced into a space 120 formed between a cover 122 and the base of each lamp 104. Because the potting compound 110 is porous, the operating gas flows through the potting compound 110 and around each lamp 104 within the recesses 102.

A cooling chamber 112 may be provided surrounding the walls of the recesses 102, allowing a cooling medium to contact the recess walls and keep the recess walls relatively cool. The cooling medium may be a liquid, such as water, or a gas and is introduced via an inlet 140 and removed at an outlet 130, flowing between the recesses 102 and cooling the walls thereof.

The operating gas is provided to the recesses 102 from the pressurized source 114 into the space 120, and may be evacuated from the recesses 102 via conduit 128, which couples the recesses 102 to a vacuum pump 134. Valve 136 controls exposure to the vacuum pump 134. The recesses 102 fluidly communicate by virtue of passages 142 and the space 120, which allow the operating gas to fill all the recesses 102. In some embodiments, some of the passages 142 may be occluded if an end portion 140 of a wall touches the window 138, for example due to thermal expansion. If all passages 142 for a single bulb recess 102 are occluded, fluid communication occurs through the potting compound 110 to space 120.

In operation, valve 136 is closed and valve 118 is opened to provide the operating gas to the recesses 102 up to a target pressure, typically less than about 10 Torr, such as between about 2 Torr and about 7 Torr, for example about 5 Torr. The operating gas may be used to transmitform an heat away from the lamp walls to the recess walls, and ultimately into the cooling fluid circulating around the recesses 102. An oxidizing gas is provided with the operating gas to form an operating atmosphere that oxidizes trace organics that may enter with the operating gas, outgas from the potting compound, or arrive from other sources. Such organics would otherwise deposit on the lamp walls during processing, darkening the lamp and potentially causing early lamp failure. Oxidizing the organics by reacting with an oxidizing gas in the energetic environment surrounding each lamp converts the organic material to $CO_2$ and $H_2O$, which is harmlessly removed when the lamp assembly 100 is pumped down.

Initially, when the lamp assembly 100 is pressurized with the operating gas, up to about 25% oxidizing gas may be added to the operating gas to provide an oxidizing environment without reducing thermal conductivity of the gas inordinately in embodiments where thermal conductivity of the gas is desired. The oxidizing gas may be one or more gases from the group of $O_2$, $O_3$, $H_2O$, $H_2O_2$, $N_2O$, nitric oxides, and air. The concentration of oxygen species in the atmosphere may be between about 1% and about 25% by volume or by mass.

In one embodiment, the lamp assembly 100 is pressurized with helium to a first pressure of about 15 Torr or less, such as about 10 Torr or less, for example about 4 Torr or less. The oxidizing gas is then pumped into the lamp assembly 100 to a second pressure above the first pressure. The second pressure may be between about 5 Torr and about 10 Torr above the first pressure.

As the lamps 104 are operated, pressure rises in the recesses as gas, usually air, leaks into the recesses 102. Eventually, enough gas leaks into the recesses 102 to reduce the thermal conductivity of the atmosphere surrounding the lamps, and the atmosphere needs to be renewed. The pressure in the lamp assembly rises as gas leaks in, until the pressure typically reaches a pressure of between about 10 Torr and about 25 Torr, such as between about 12 Torr and about 20 Torr, for example about 15 Torr or 20 Torr. With the valve 118 closed, the valve 136 is opened, exposing the recesses 102 to vacuum from the vacuum pump 134. The recesses 102 are pumped down to a third pressure below about 1 Torr, for example less than about 0.1 Torr, and then the atmosphere in the recesses 102 is reconstituted with gas from the source 114 and oxidizing gas, as described above, by pumping helium into the chamber of the lamp assembly 100 to a fourth pressure of about 15 Torr or less and pumping the oxidizing gas into the chamber to a fifth pressure between about 5 Torr and about 10 Torr above the fourth pressure. The fifth pressure may be between about 10 Torr and about 25 Torr, for example about 20 Torr.

In the embodiment of FIG. 1, an optional valve 119 and line 117 may be provided to couple air from the environment into the port 116 through opening 115. Use of a valve may improve control of the mixture of operating gas and oxidizing gas provided to the lamp assembly. The line 117 intersects the port 116 at a location selected to provide a mixing length 113 between the intersection of the line 117 and the port 116 and the entry point of the port 116 into the space 120. A longer mixing length 113 may improve mixing of the operating gas and the oxidizing gas prior to entry into the recesses 102. Good mixing of the operating gas and the oxidizing gas facilitates oxidative capacity in all the lamp recesses 102. Alternately, a source of pressurized oxidizing gas may be coupled to the line 117 and valve 119 at the opening 115.

Figure 2:
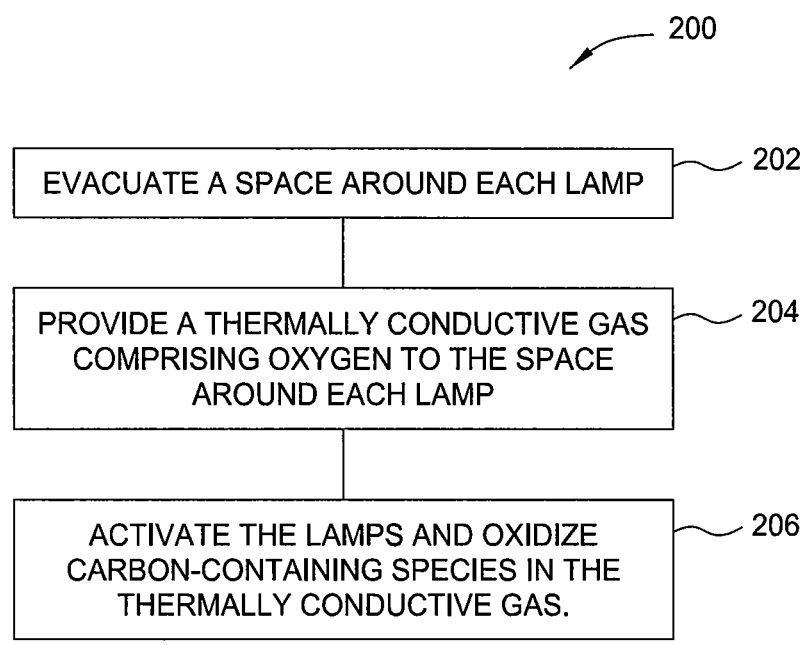
FIG. 2 is a flow diagram summarizing a method according to another embodiment.

FIG. 2 is a flow diagram summarizing a method 200 according to one embodiment. The method 200 may be performed on any assembly of lamps for thermal processing to prevent degradation from exposure to organic or carbon-containing species. The space around each lamp is evacuated at 202, usually by vacuum pump. At 204, a operating gas comprising oxygen is provided to the space surrounding each lamp. The operating gas may comprise any gas capable of regulating lamp temperature by carrying heat away from the lamps, so long as the gas does not react adversely with any materials at processing conditions. Helium is an example of a gas that may be beneficially used. Hydrogen may also be used, with appropriate safety precautions.

An oxidizing gas is mixed with the operating gas to scavenge carbon containing species that may enter the space around each lamp. The oxidizing gas may be a source of oxygen to react with the carbon containing species. Exemplary oxidizing gases that may be used to practice the method 200 include $O_2$, $O_3$, $H_2O$, $H_2O_2$, $N_2O$, nitric oxides, and air. The oxidizing gas is added up to a point beyond which the thermal conductivity of the gas begins to decline. In one embodiment, the atmosphere around each lamp is charged with gas to a pressure of about 5 Torr, about 25% of which is an oxidizing gas. Lower pressures may be used, and lower concentrations of oxygen containing gas may be used. The concentration of oxidizing gas in the atmosphere may be between about 1% and about 25% by volume or by mass.

At 206, the lamps are activated for processing. Heat from the lamps drives a gas phase reaction between oxygen containing species and carbon containing species in the atmosphere or on heated parts of the lamp and reflector assembly. The carbon containing species are converted to CO and $CO_2$, consuming the oxygen atoms from the atmosphere. As the lamps are operated, cycling on and off through a number of operating cycles, more oxidizing gas may be added to the atmosphere to make up for the lost oxygen. In one embodiment, the lamp assembly is engineered to allow air to leak into the space around the lamps as they are operated, for example through the porous potting compound. The pressure of the atmosphere grows and its thermal conductivity declines as concentration of operating gases decline in favor of $CO_2$. When the thermal conductivity of the gas reaches a low tolerance threshold, the gas is replaced by pumping out. In one embodiment, the gas is replaced when the pressure around the lamps is between about 15 Torr and about 25 Torr, for example about 20 Torr. The cycle may then be repeated. In one embodiment, the method 200 is repeatedly performed at least 10 times before maintaining any of the lamps in the lamp assembly, a significant improvement over the longevity of a typical lamp.

In some embodiments, oxygen containing species may be supplied to the space around the lamps by including such species in the potting compound that holds the lamps in place in the lamp assembly. A volatile oxidant or a thermally releasable oxidant may be incorporated in the potting compound. White colored species such as nitrates and perchlorates may be useful in this regard. In other embodiments, gas may be continuously flowed through the space around the lamps to maintain an equilibrium of pressure, thermal conductivity, and concentration of oxidizing species in the atmosphere. As $CO_2$ is generated from oxidizing carbon containing species in the atmosphere, the $CO_2$ is continuously removed, and helium (or another inert gas) and oxidizing gas are supplied. In one embodiment, a mixture of 4 parts helium and 1 part oxidizing gas is supplied to the lamp assembly, and flow out of the lamp assembly to a vacuum pump is controlled to achieve a desired pressure in the lamp assembly, such as between about 5 Torr and about 10 Torr.

While the foregoing is directed to embodiments of the invention, other and further embodiments of the invention may be devised without departing from the basic scope thereof.

What is claimed is:

1. A method of operating a process lamp, comprising: immersing the lamp in a recess within a lamp assembly, the recess having an operating atmosphere comprising between about 1% and about 25% of an oxidizing gas, wherein a line is configured to couple air into the recess though an opening in the lamp assembly, and wherein the immersing the lamp in an operating atmosphere comprises evacuating a chamber containing the lamp, pumping helium into the chamber to a first pressure of about 15 Torr or less, pumping the oxidizing gas into the chamber to a second pressure above the first pressure, and allowing air to leak into the chamber until the chamber pressure is between about 10 Torr and about 25 Torr; and oxidizing hydrocarbons in the thermally conductive atmosphere.

2. A method of operating a process lamp, comprising: immersing the lamp in a recess within a lamp assembly, the recess having an operating atmosphere comprising between about 1% and about 25% of an oxidizing gas, wherein a line is configured to couple air into the recess though an opening in the lamp assembly, wherein the immersing the lamp comprises evacuating a chamber containing the lamp, filling the chamber with helium, and adding the oxidizing gas to the helium in the chamber, and wherein the removing and replacing the operating atmosphere comprises reducing the pressure in the chamber to a third pressure below about 1 Torr, pumping helium into the chamber to a fourth pressure of about 15 Torr or less, and pumping the oxidizing gas into the chamber to a fifth pressure above the fourth pressure; and oxidizing hydrocarbons in the thermally conductive atmosphere.

3. A method of operating a lamp, comprising:
establishing a thermally conductive atmosphere comprising oxygen and helium surrounding the lamp at a first pressure of about 15 Torr or less, wherein a line is configured to couple air into the thermally conductive atmosphere though an opening, and wherein the establishing comprises providing a gas selected from the group consisting of $O_2$, $O_3$, and $H_2O_2$;
leaking air into the thermally conductive atmosphere until the pressure reaches at least about 5 Torr above the first pressure while operating the lamp; and
evacuating the thermally conductive atmosphere to a pressure less than about 1 Torr.

4. The method of claim 3, wherein the establishing a thermally conductive atmosphere comprising oxygen and helium further comprises volatilizing an oxygen containing species from the potting compound of the lamp.

5. The method of claim 4, wherein the oxygen containing species is a peroxide, nitrate, or perchlorate compound.

6. The method of claim 4, wherein the establishing a thermally conductive atmosphere comprising oxygen and helium surrounding the lamps comprises providing air.

7. The method of claim 3, wherein the thermally conductive atmosphere comprises about 25% air and about 75% helium.

8. The method of claim 3, further comprising repeating the establishing, leaking and evacuating for at least 10 days before maintaining the lamp.

* * * * *

UNITED STATES PATENT AND TRADEMARK OFFICE
CERTIFICATE OF CORRECTION

PATENT NO. : 9,175,908 B2
APPLICATION NO. : 13/445543
DATED : November 3, 2015
INVENTOR(S) : Ranish It is certified that error appears in the above-identified patent and that said Letters Patent is hereby corrected as shown below:

In the specification

Column 3, Line 11, delete "transmitform an" and insert --transmit-- therefor.

Signed and Sealed this
First Day of March, 2016

Michelle K. Lee
*Director of the United States Patent and Trademark Office*